US008847185B2

(12) United States Patent
Theis et al.

(10) Patent No.: US 8,847,185 B2
(45) Date of Patent: Sep. 30, 2014

(54) PHASE-LOCKED WEB POSITION SIGNAL USING WEB FIDUCIALS

(75) Inventors: Daniel J. Theis, Mahtomedi, MN (US); Daniel H. Carlson, Arden Hills, MN (US); Brian K. Nelson, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 447 days.

(21) Appl. No.: 13/130,592

(22) PCT Filed: Dec. 7, 2009

(86) PCT No.: PCT/US2009/066945
§ 371 (c)(1),
(2), (4) Date: May 23, 2011

(87) PCT Pub. No.: WO2010/077592
PCT Pub. Date: Jul. 8, 2010

(65) Prior Publication Data
US 2011/0257779 A1    Oct. 20, 2011

Related U.S. Application Data

(60) Provisional application No. 61/141,128, filed on Dec. 29, 2008.

(51) Int. Cl.
G01N 21/86 (2006.01)
G05B 19/404 (2006.01)
(52) U.S. Cl.
CPC .................................. *G05B 19/404* (2013.01)
USPC ........................................... 250/548; 356/429
(58) Field of Classification Search
USPC ................ 356/614–620, 429–431; 250/559.29–559.38
See application file for complete search history.

(56) References Cited

U.S. PATENT DOCUMENTS

| 1,898,723 | A |   | 2/1933  | Fuller |
|-----------|---|---|---------|--------|
| 3,570,735 | A |   | 3/1971  | Kurz |
| 3,615,048 | A |   | 10/1971 | Martin |
| 3,667,031 | A |   | 5/1972  | Cox, Jr. |
| 4,010,463 | A |   | 3/1977  | Kay |
| 4,021,031 | A |   | 5/1977  | Meihofer |
| 4,049,213 | A |   | 9/1977  | Hank |
| 4,274,748 | A |   | 6/1981  | Burtin |
| 4,284,221 | A |   | 8/1981  | Nagel |
| 4,363,271 | A | * | 12/1982 | Horst ............................ 101/181 |
| 4,401,893 | A |   | 8/1983  | Dehuysser |

(Continued)

FOREIGN PATENT DOCUMENTS

CN    2447719 Y    9/2001
CN    101191784    6/2008

(Continued)

*Primary Examiner* — Charles Garber
*Assistant Examiner* — Evren Seven
(74) *Attorney, Agent, or Firm* — Steven E. Skolnick; Yufeng Dong

(57) ABSTRACT

Approaches for enhancing web position determination involve phase locking a web movement encoder signal to a sensed web fiducial signal. Fiducials disposed along a longitudinal axis of a substrate are sensed and corresponding sensor signals are generated. An estimated web position is provided by one or more encoder signals. The phase difference between the sensor signals and the encoder signals is calculated and the web position error is determined based on the phase difference. The web position error signal can be fed back to adjust the encoder signals which improves the accuracy of the web position determination.

10 Claims, 11 Drawing Sheets

(56) References Cited

U.S. PATENT DOCUMENTS

| | | | | |
|---|---|---|---|---|
| 4,485,982 A | * | 12/1984 | St. John et al. | 242/563.1 |
| 4,529,922 A | | 7/1985 | Ono | |
| 4,532,430 A | | 7/1985 | Ross | |
| 4,569,584 A | * | 2/1986 | St. John et al. | 399/301 |
| 4,610,739 A | | 9/1986 | Jensen | |
| 4,618,518 A | | 10/1986 | Pricone | |
| 4,697,485 A | | 10/1987 | Raney | |
| 4,731,542 A | * | 3/1988 | Doggett | 250/548 |
| 4,734,868 A | * | 3/1988 | DeLacy | 358/1.12 |
| 4,808,832 A | * | 2/1989 | Doggett | 250/548 |
| 4,893,135 A | | 1/1990 | Jamzadeh | |
| 4,924,266 A | * | 5/1990 | Negoro et al. | 399/21 |
| 4,945,252 A | | 7/1990 | Lerner | |
| 5,047,651 A | | 9/1991 | Wessner | |
| 5,300,961 A | * | 4/1994 | Corona et al. | 347/116 |
| 5,355,154 A | | 10/1994 | Guerin | |
| 5,384,592 A | * | 1/1995 | Wong | 347/116 |
| 5,450,116 A | | 9/1995 | Weiselfish | |
| 5,579,092 A | * | 11/1996 | Isobe et al. | 399/39 |
| 5,667,123 A | | 9/1997 | Fukuda | |
| 5,768,776 A | | 6/1998 | Pendse | |
| 5,778,724 A | | 7/1998 | Clapp | |
| 5,859,707 A | | 1/1999 | Nakagawa | |
| 5,870,204 A | | 2/1999 | Chiu | |
| 5,875,023 A | | 2/1999 | Burke | |
| 5,931,097 A | | 8/1999 | Neifert | |
| 6,053,107 A | * | 4/2000 | Hertel et al. | 101/490 |
| 6,056,180 A | | 5/2000 | Crowley | |
| 6,087,655 A | | 7/2000 | Kobrin | |
| 6,164,201 A | | 12/2000 | Burke | |
| 6,199,480 B1 | * | 3/2001 | Leonhardt et al. | 101/248 |
| 6,273,313 B1 | | 8/2001 | Noll | |
| 6,336,019 B2 | * | 1/2002 | Castelli et al. | 399/162 |
| 6,375,870 B1 | | 4/2002 | Visovsky | |
| 6,396,073 B1 | | 5/2002 | Taylor | |
| 6,495,214 B1 | | 12/2002 | Nentwich et al. | |
| 6,505,906 B1 | | 1/2003 | Bland | |
| 6,521,905 B1 | | 2/2003 | Luxem | |
| 6,647,128 B1 | | 11/2003 | Rhoads | |
| 7,121,496 B2 | * | 10/2006 | Jackson | 242/563.1 |
| 7,133,630 B2 | * | 11/2006 | Sakai | 399/301 |
| 7,174,237 B2 | | 2/2007 | Takayama | |
| 7,296,717 B2 | | 11/2007 | Swanson | |
| 7,526,230 B2 | * | 4/2009 | Kudo et al. | 399/167 |
| 7,560,718 B2 | | 7/2009 | Wittmann | |
| 7,573,580 B2 | * | 8/2009 | Swindal | 356/499 |
| 7,826,041 B2 | | 11/2010 | Takeda | |
| 8,405,831 B2 | * | 3/2013 | Carlson et al. | 356/429 |
| 2002/0018220 A1 | | 2/2002 | Aoki | |
| 2002/0121131 A1 | | 9/2002 | Mancevski | |
| 2002/0122186 A1 | | 9/2002 | Igaki | |
| 2003/0218125 A1 | | 11/2003 | Igaki | |
| 2004/0022557 A1 | * | 2/2004 | Kudo | 399/167 |
| 2004/0024513 A1 | | 2/2004 | Aizawa et al. | |
| 2004/0197443 A1 | | 10/2004 | Scarabelli | |
| 2004/0227644 A1 | | 11/2004 | Lin | |
| 2004/0262505 A1 | | 12/2004 | Atsuta | |
| 2005/0218237 A1 | | 10/2005 | Lapstun | |
| 2005/0232475 A1 | | 10/2005 | Floeder | |
| 2005/0263689 A1 | | 12/2005 | Atsuta | |
| 2005/0274880 A1 | | 12/2005 | Atsuta | |
| 2006/0174992 A1 | | 8/2006 | Brost | |
| 2006/0210714 A1 | | 9/2006 | Huizinga | |
| 2007/0099396 A1 | | 5/2007 | Hirai | |
| 2007/0138153 A1 | | 6/2007 | Redman | |
| 2008/0039718 A1 | | 2/2008 | Drinan | |
| 2008/0073493 A1 | | 3/2008 | Atsuta | |
| 2008/0219741 A1 | * | 9/2008 | McNestry et al. | 400/234 |
| 2010/0097462 A1 | * | 4/2010 | Carlson et al. | 348/143 |
| 2010/0187277 A1 | | 7/2010 | Carlson | |
| 2010/0188668 A1 | | 7/2010 | Carlson | |
| 2010/0196607 A1 | | 8/2010 | Carlson | |

FOREIGN PATENT DOCUMENTS

| | | |
|---|---|---|
| DE | 197 54 776 | 6/1999 |
| EP | 0 838 665 | 4/1998 |
| EP | 1 235 054 | 8/2002 |
| EP | 1 722 021 | 11/2006 |
| GB | 2 065 871 | 7/1981 |
| GB | 2 195 179 | 3/1988 |
| JP | 62-111860 | 5/1987 |
| JP | 02-037963 | 8/1990 |
| JP | 05-010725 | 1/1993 |
| JP | 07-181032 | 7/1995 |
| JP | 11-167165 A | 6/1999 |
| JP | 2005-049237 | 2/2005 |
| JP | 2005-178962 | 7/2005 |
| WO | WO 2005/106104 | 11/2005 |
| WO | WO 2006/107057 | 10/2006 |
| WO | WO 2007/027757 | 3/2007 |
| WO | WO 2008/088650 | 7/2008 |
| WO | WO/2008/088650 * | 7/2008 |
| WO | WO 2010/077719 | 7/2010 |

* cited by examiner

PHASE-LOCKED WEB POSITION SIGNAL USING WEB FIDUCIALS

CROSS REFERENCE TO RELATED APPLICATIONS

This application is a national stage filing under 35 U.S.C. 371 of PCT/US2009/066945, filed Dec. 7, 2009, which claims priority to Provisional Patent Application No. 61/141,128, filed Dec. 29, 2008, the disclosure of which is incorporated by reference in its/their entirety herein.

TECHNICAL FIELD

The present disclosure is related to methods and systems for determining longitudinal position of an elongated web.

BACKGROUND

Fabrication of many articles, including flexible electronic or optical components, involves registration between layers of material deposited or formed on an elongated substrate or web. The formation of the material layers on the web may occur in a continuous process or a step and repeat process involving multiple steps. For example, patterns of material may be deposited in layers on an elongated web through multiple deposition steps to form layered electronic or optical devices. Other articles require precise registration of features that are applied on one or both sides of the web.

To achieve accurate registration between the layers, lateral crossweb positioning and longitudinal downweb positioning must be maintained as the web moves through multiple manufacturing steps. Maintaining registration between layers formed on the web becomes more complex when the web is flexible or stretchable. Fabrication of some articles involves multiple passes (or stages) that apply material or processes to the web and which require precise position registration between the process steps.

SUMMARY

Embodiments of the present disclosure involve methods and systems for determining the longitudinal position of an elongated web. One embodiment involves a method of generating an error signal representing the error in an estimated error signal. Fiducials disposed along a longitudinal axis of a substrate are sensed and corresponding sensor signals are generated based on the sensed fiducials. One or more web movement signals are generated, such as by the encoder of a web transport pull roller. A phase difference between the sensor signals and the movement signals is determined. An error signal is generated based on the phase difference.

Another embodiment of the invention is directed to a web position system. A sensor module senses one or more fiducials disposed along a longitudinal axis of a substrate and generates one or more continuous, periodic sensor signals based on the fiducial marks. A signal generator generates one or more continuous, periodic signals based on movement of the substrate. A phase detector determines a phase difference between the sensor signals and the movement signals and generates an error signal based on the phase difference.

The above summary of the present disclosure is not intended to describe each embodiment or every implementation of the present disclosure. Advantages and attainments, together with a more complete understanding of the disclosure, will become apparent and appreciated by referring to the following detailed description and claims taken in conjunction with the accompanying drawings.

Figure 1A:
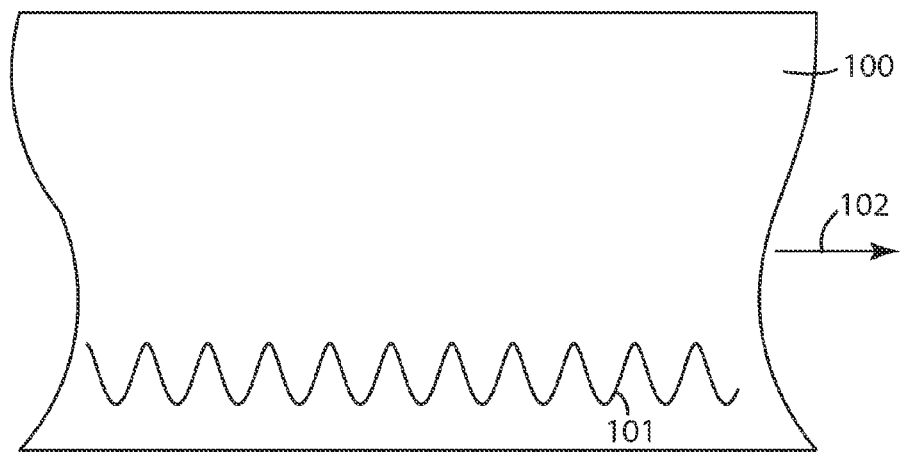
FIGS. 1A-1F show various configurations of substantially continuous fiducial marks disposed longitudinally on an elongated web in accordance with embodiments of the disclosure.
Figure 1B:
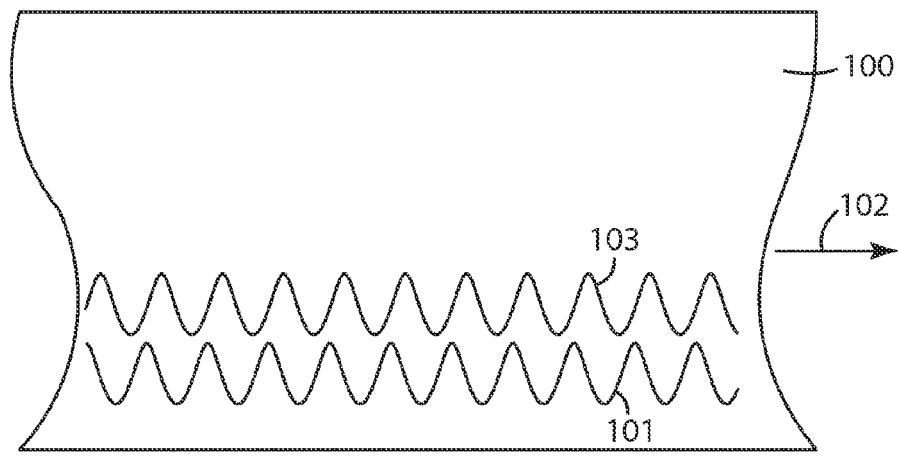

While the disclosure is amenable to various modifications and alternative forms, specifics thereof have been shown by way of example in the drawings and will be described in detail. It is to be understood, however, that the intention is not to limit the disclosure to the particular embodiments described. On the contrary, the intention is to cover all modifications, equivalents, and alternatives falling within the scope of the invention as defined by the appended claims.

DETAILED DESCRIPTION

In the following description of the illustrated embodiments, reference is made to the accompanying drawings which form a part hereof, and in which is shown by way of illustration, various embodiments in which the disclosure may be practiced. It is to be understood that the embodiments may be utilized and structural changes may be made without departing from the scope of the present disclosure.

Embodiments described in the present disclosure illustrate methods and systems for determining the longitudinal position of a web based on continuous fiducial markings disposed longitudinally on the web. Determination of the position of an elongated web allows alignment of the web during successive processing steps. For example, embodiments of the disclosure may be used to facilitate alignment between multiple layers of material deposited on a web during a roll to roll manufacturing process. The processes described herein are particularly useful for aligning the layers of multi-layer electronic devices formed on a web. Approaches using discrete fiducial marks disposed on the web to determine the longitudinal web position only provide periodic position detection and do not provide position information during intervals between the discrete marks. The fiducial marks illustrated by the various embodiments discussed herein may be used to provide continuous longitudinal position updates and more accurate web positioning.

The approaches of the present disclosure automatically compensate for changes in web strain that commonly occur in web processing applications. As web strain is increased (i.e. the web is stretched more) the longitudinal web fiducials are stretched along with corresponding elements or features formed on the web. This allows the web fiducials to be used to accurately track the position of elements deposited on the web. For example, the fiducials may be deposited on the web substantially simultaneously with a layer of web elements. As the fiducials and the web elements are deposited, the elements deposited on the web and the fiducials experience the same amount of web strain. The fiducials may be used to accurately track the position of the web elements, regardless of the amount of web strain in subsequent processes. Using the approaches described herein, accurate registration to web elements can be achieved even when the web is stretched.

FIGS. 1A-1F illustrate fiducial marks of various configurations in accordance with embodiments of the disclosure. The fiducial marks are substantially continuous or piecewise continuous and are disposed along the longitudinal axis of the web such as along a web edge. The fiducial marks generally have regions where the slope of the marks is finite and non-zero relative to the longitudinal axis of the web.

The fiducial marks may be non-periodic or periodic functions with respect to the web longitudinal axis, for example. As described in more detail below, periodic fiducial marks may be used to determine both coarse and fine position of the web. The combination of coarse and fine position information provides high resolution position measurement over a large distance.

In some embodiments, a single substantially continuous fiducial mark may be used to determine longitudinal position. A single substantially continuous fiducial mark is illustrated as a sinusoidal mark 101 disposed along the longitudinal axis 102 of the web 100 in FIG. 1A. In other embodiments, two sinusoidal marks are used, as illustrated by the sine 101 and cosine 103 marks of FIG. 1B. Use of two substantially continuous fiducial marks such as the sine 101 and cosine 103 marks provides redundant information yielding substantially higher noise immunity, accuracy, and resolution than a single mark.

Figure 1C:
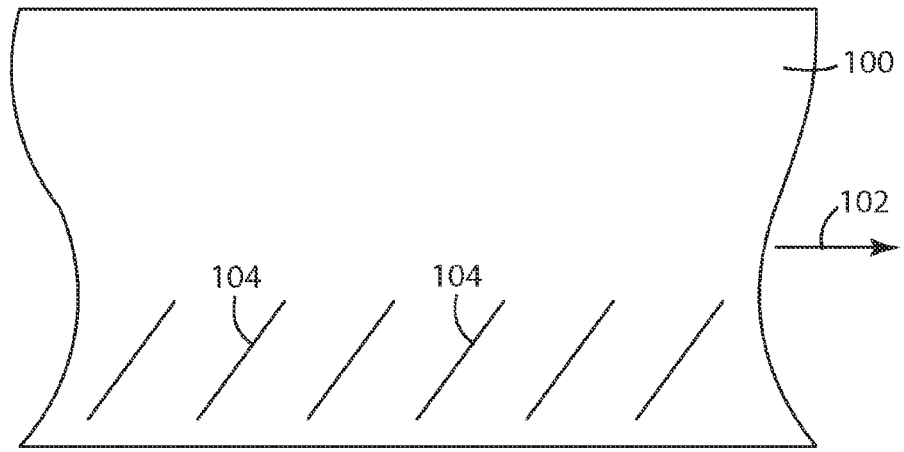
Figure 1D:
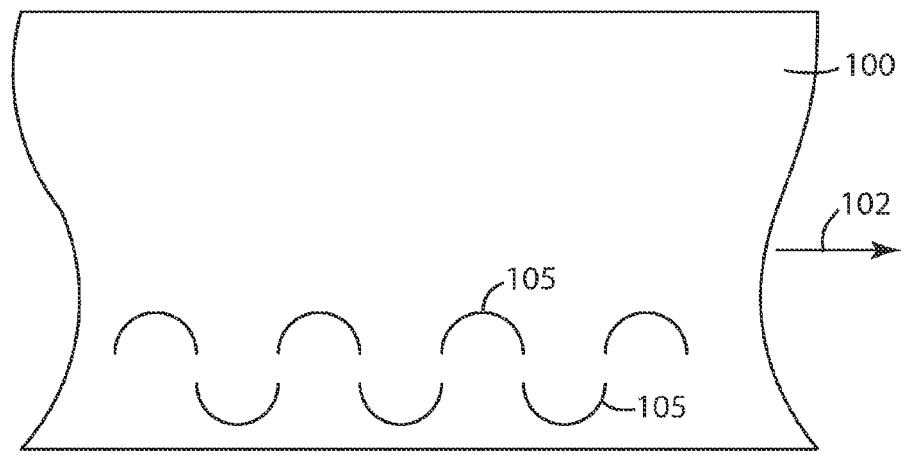

In some embodiments, the fiducial marks may comprise piecewise continuous marks as illustrated in FIG. 1C. Piecewise continuous marks are particularly useful for fiducial marking methods that produce voids in the web where continuous marks would cut off a portion of the web. The fiducial marks illustrated in FIG. 1C comprise a series of diagonal lines 104 having finite, non-zero slope with respect to the web longitudinal axis 102. Non-linear, piecewise continuous patterns are also possible as illustrated by the non-linear piecewise continuous fiducial marks 105 of FIG. 1D.

Substantially continuous fiducial marks such as those illustrated in FIGS. 1A-1D may be used to track the longitudinal position of the web in systems where lateral shifts in web position are negligible and/or lateral position of the web is maintained over the longitudinal distance tracked. In systems where the lateral position of the web is non-negligible, lateral web motion may be controlled to more accurately determine longitudinal distance. In some embodiments, lateral web motion may be detected and taken into account during determination of longitudinal distance.

Figure 1E:
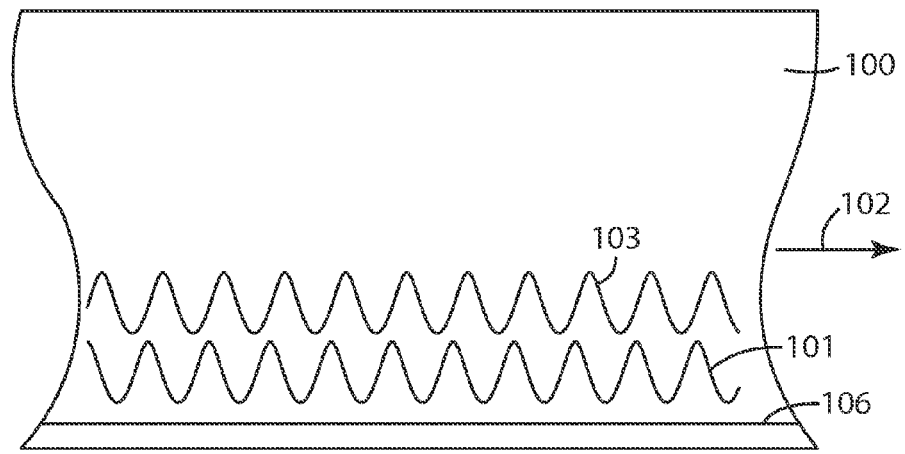
Figure 1F:
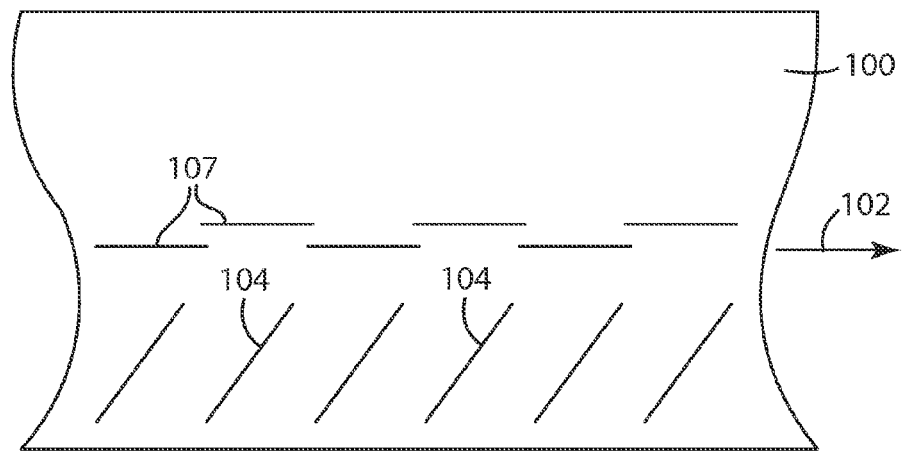

In some implementations, lateral web motion is determined using the web edge or fiducial marks disposed on the web. For example, a web edge or horizontal line disposed on the web may provide lateral position information. The lateral position reference may be used in addition to the one or more continuous fiducial marks that provide longitudinal position information. FIG. 1E illustrates a horizontal line 106 disposed on the web 100 that may be used for lateral position sensing in addition to sine 101 and cosine 103 marks used for longitudinal position sensing in accordance with one embodiment. FIG. 1F illustrates a series horizontal lines 107 for sensing lateral position and a series of diagonal lines 104 for sensing longitudinal position in accordance with one embodiment. The configuration illustrated in FIG. 1F is particularly useful for fiducial marking methods that produce voids in the web such as cutting the web or laser ablation of the web.

The fiducial marks comprise patterns made on the web or applied to the web. In optical configurations, the fiducial marks modulate either transmitted or reflected light. The marks may be made or applied to the web by contact direct printing, ink jet printing, laser printing, laser marking, ablation, microreplication, scribing, embossing, casting, coating and/or other methods.

Figure 2A:
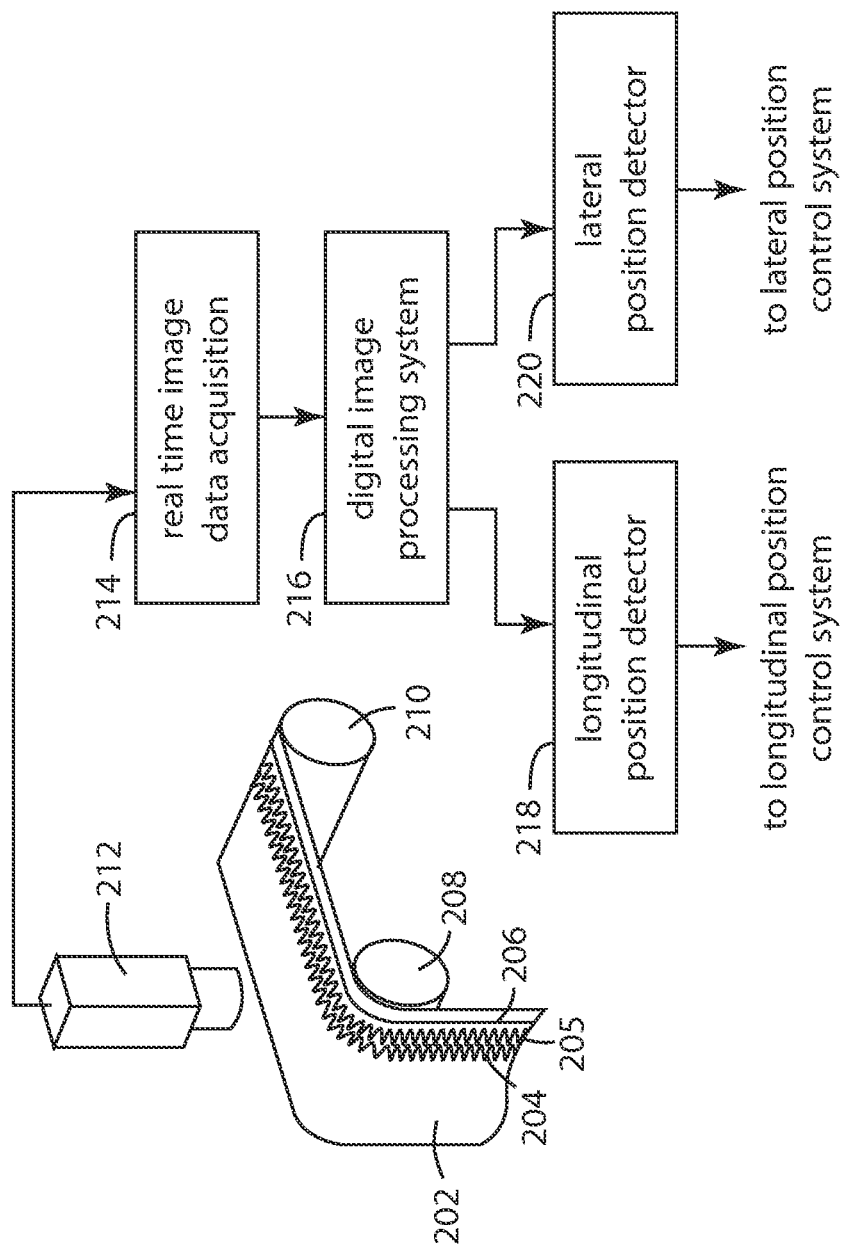
FIG. 2A is a block diagram of a web position detector configured to determine the longitudinal and lateral position of a web in accordance with embodiments of the disclosure.

FIG. 2A is a block diagram of a web position detector configured to determine the longitudinal and lateral position of a web in accordance with embodiments of the disclosure. In this embodiment, a single sensor 212 is used to sense both longitudinal and lateral fiducial marks 204-206. In other configurations, a first sensor is used to sense a lateral fiducial and a second sensor is used to sense a longitudinal fiducial mark.

As illustrated in FIG. 2A, the web 202 includes longitudinal fiducial marks comprising sine and cosine marks 204, 205. The web 202 also has a lateral fiducial mark comprising a horizontal mark 206. As the web 202 passes between rollers 208, 210, the sensor 212 senses both the longitudinal fiducial marks 204, 205 and the lateral fiducial mark 206. The sensor 212 may be camera or other type of optical sensor, an electromagnetic sensor, a density sensor, a contact sensor, or any other type of sensor capable of sensing a fiducial mark. In the embodiment illustrated in FIG. 2A, the sensor comprises a CCD camera.

The output of the camera 212 is directed to image data acquisition circuitry 214 that acquires and digitizes the image of the fiducial marks 204-206 from the camera 212. The digital image of the fiducial marks from the image data acquisition circuitry 214 is directed to a digital image processing system 216. The digital image processing system 216 analyzes the image to generate signals corresponding to the sensed fiducial marks. The signals generated by the digital image processing system 216 may be output to a longitudinal position detector 218 and optionally to a lateral position detector 220. Information from the lateral web position detector 220 may be used by the longitudinal web position detector 218 to enhance interpolation of the longitudinal web position. The longitudinal and lateral position determined by the longitudinal web position detector 218 and the lateral web position detector 220, respectively, may be output to a movement control system configured to control the longitudinal and lateral position of the web.

Using substantially continuous fiducial marks for longitudinal web positioning, the position of the web may be determined to an accuracy of better than 1 micron. The accuracy and resolution are determined by several factors. One factor is the level of contrast in the fiducial marks produced by the marking process and available to the sensor. The higher the contrast, the greater resolution that will be possible. Another factor affecting accuracy and resolution is how small the repetitive cycle (period) can be made. Yet another factor affecting accuracy and resolution is the resolution of the sensor. For example, with a sinusoid fiducial having a 1 mm period and 12 bit sensor resolution, a resolution of about 0.25 microns or even about 0.1 micron is attainable.

The substantially horizontal fiducial mark 206 may be used for lateral position sensing. Additionally or alternatively, the horizontal fiducial mark 206 may be used as a reference fiducial to determine the amplitudes of the fiducial marks 204, 205.

Figure 2B:
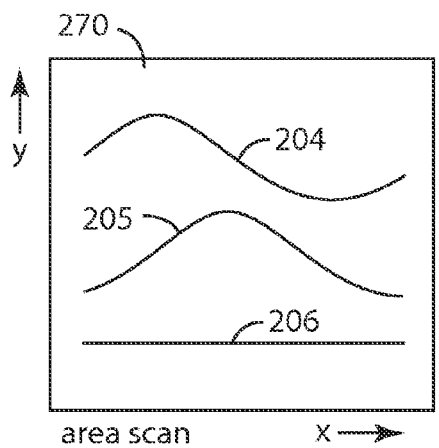
FIG. 2B illustrates an example of an image view of an area sensor that may be used to sense fiducial marks in accordance with embodiments of the disclosure.
Figure 2D:
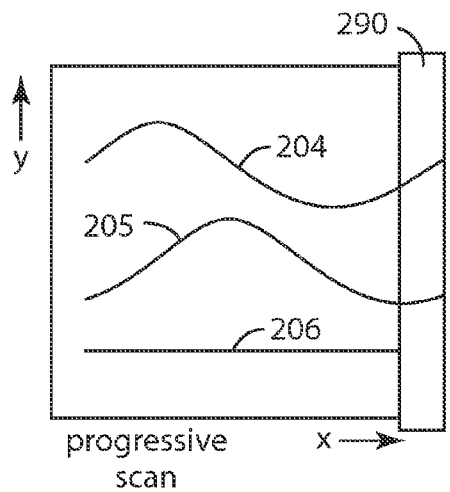
FIG. 2D shows the image view of a progressive scan sensor that may be used to sense fiducial marks in accordance with embodiments of the disclosure.
Figure 2C:
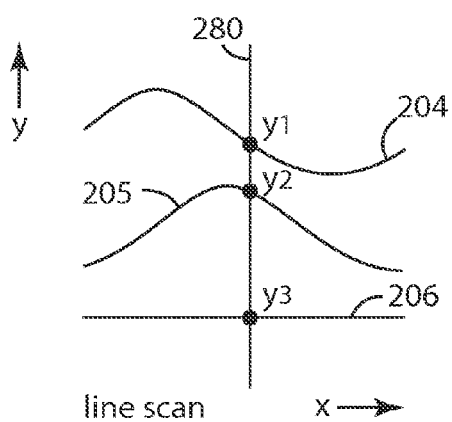
FIG. 2C illustrates an example of an image view of a line scan sensor that may be used to sense fiducial marks in accordance with embodiments of the disclosure.

FIGS. 2B-2D illustrate examples of the image field of various types of sensors. FIG. 2B shows fiducial marks 204, 205, 206 within the image field 270 of an area sensor. The area sensor outputs an X, by Y array of values that represent the light intensity of each pixel location. An area sensor provides a large amount of data for signal processing. The large data set allows comparison of the current view with the last view and more sophisticated filtering of the data leading to possible advantages in position accuracy, for example. Area sensors provide a slower position update rate when compared to some other types of sensors due to the time it takes to acquire and process the relatively larger data set.

FIG. 2C shows fiducial marks 204, 205, 206 within the image field 280 of a line scan sensor. The line scan sensor outputs a 1 by $Y_n$ vector of pixel intensity. The line scan sensor provides rapid position updates when compared to the area sensor, but data storage of the position history is required.

In FIG. 2D, fiducial marks 204, 205, 206 are shown within the image field 290 of a progressive scan sensor. Generally area scan sensors allow the user to select the number of lines to scan, e.g., $X_n=4$ or other number. The progressive scan sensor provides more data for signal processing than the line scan, but is slower.

The sine and cosine marks 204, 205 may be scaled to achieve maximum resolution. For example, the amplitudes of the marks may be made as large as possible to maximize the marks 204, 205 within the image view 270, 280, 290 of the sensor, with some margin to allow for lateral position errors. The longitudinal scaling may be selected based on expected speed of operation. Using a sharper pitch of the sine and cosine marks 204, 205 (higher frequency and smaller peak to peak distance) provides steeper slopes, and more resolution in the longitudinal direction. An excessively high pitch can reduce signal to noise ratio and also increases the required sampling rate. The minimum sampling rate requires that no more than ½ cycle passes between samples. However, operation is enhanced when a sampling rate at least 3 to 4 times the minimum sampling rate is used. The achievable sampling rate varies with the type of sensor used, but rates in excess of 1 kHz are possible with camera sensors.

Figure 3:
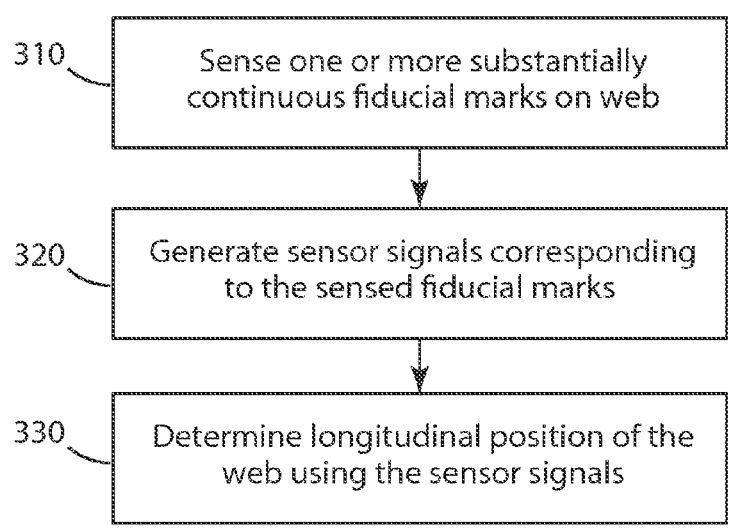
FIG. 3 is a diagram illustrating a method for determining longitudinal web position in accordance with embodiments of the disclosure.

The diagram of FIG. 3 illustrates a method for determining longitudinal web position in accordance with embodiments of the disclosure. The method involves sensing 310 one or more substantially continuous fiducial marks disposed longitudinally on a web. Sensor signals corresponding to the sensed fiducial marks are generated 320. The longitudinal position of the web is determined 330 using the sensor signals.

Periodic fiducial marks, such as sine and/or cosine marks contain information that may be used to determine coarse and fine position of the web. The coarse position may be determined from periodically recurring features of the periodic fiducial marks. In the case of sine or cosine fiducial marks, the periodically recurring features used to determine coarse longitudinal position of the web may include peaks or zero crossings, for example.

Figure 4:
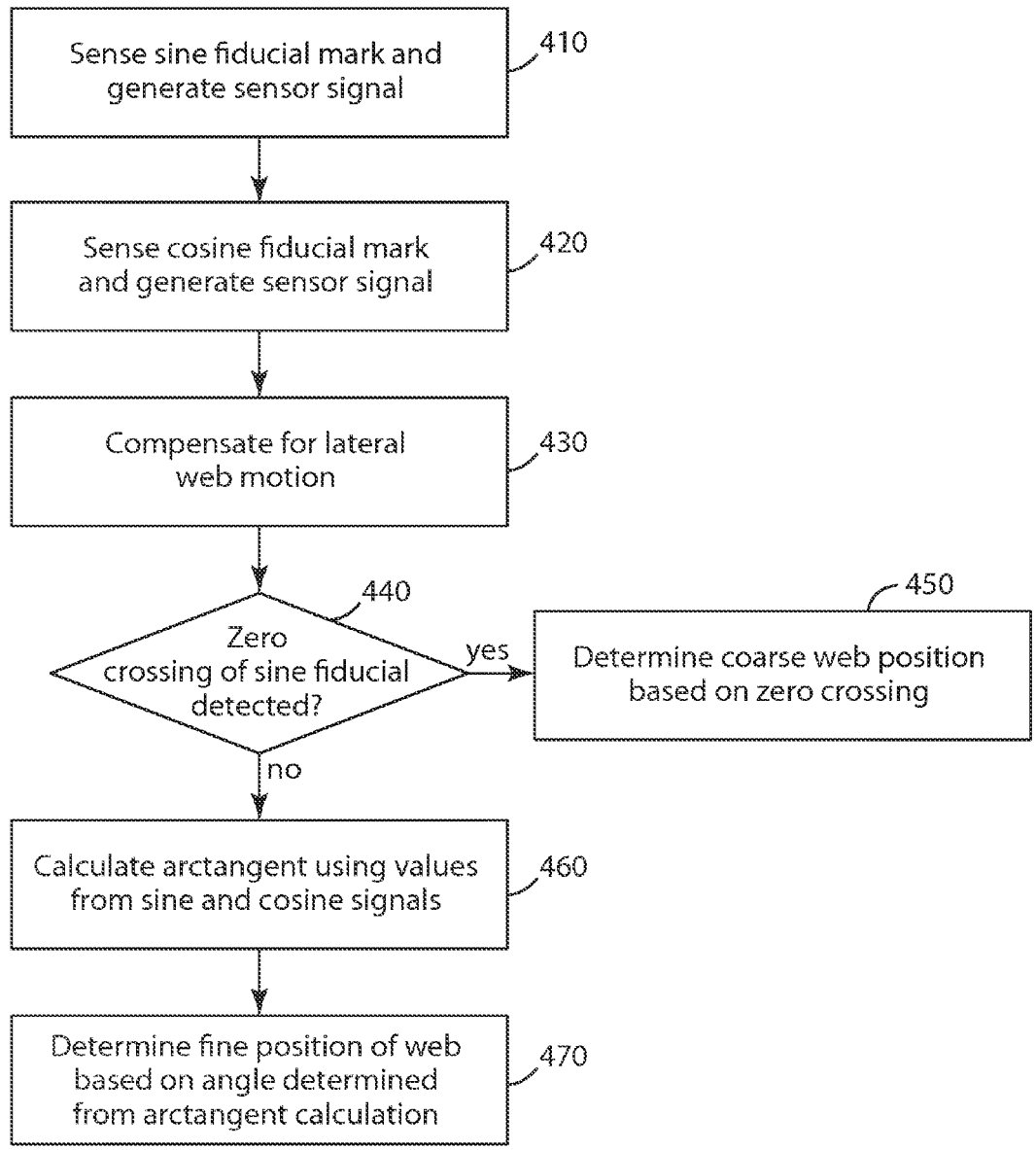
FIG. 4 is a diagram illustrating a method of determining coarse and fine position of a web using sine and cosine fiducial markings in accordance with embodiments of the disclosure.

In one embodiment using sine and cosine fiducial marks, zero crossings of each cycle are counted to determine coarse position. By taking the arctan 2 function, with proper sign handling of the sine and cosine signals, the fine position within any cycle may be determined. The diagram of FIG. 4 illustrates a method for determining longitudinal web position using coarse and fine positioning available from sine and cosine fiducial marks. Sine and cosine marks disposed on the web are sensed and sensor signals are generated 410, 420 corresponding to the sine and cosine marks. The method includes some process to compensate 430 for lateral web movement. For example, lateral web motion may be tracked using a lateral fiducial reference, such as a fiducial mark or web edge. Through the use of a lateral reference, the web may be accurately positioned within the sensor window. Alternatively, a running min-max detector with a duration of about 3 cycles may be used. Because the peak to peak amplitude of the sine and cosine signals is fixed, lateral motion of the web can be determined by noting the changes in the maximum and minimum peak value of each sine and cosine value. A change in both the maximum peak and the minimum peak in fixed relation to each other indicates a shift in the lateral position of the web. Direct sensing of a lateral fiducial is preferred as it reduces both signal processing complexity as well as reduces the lag time of the measurement. A web edge may also be used for determining lateral movement.

The sine and cosine signals are digitized and may be filtered or otherwise processed. The system searches 440 for a zero crossing of the sine mark. When the zero crossing is located, the zero crossing is counted and the coarse web position is determined 450. The arctan 2 function of the sine and cosine signal values is calculated 460. The angle and quadrant determined from the arctan 2 calculation provides 460 the fine position of the web referenced from the closest zero crossing.

Figure 5:
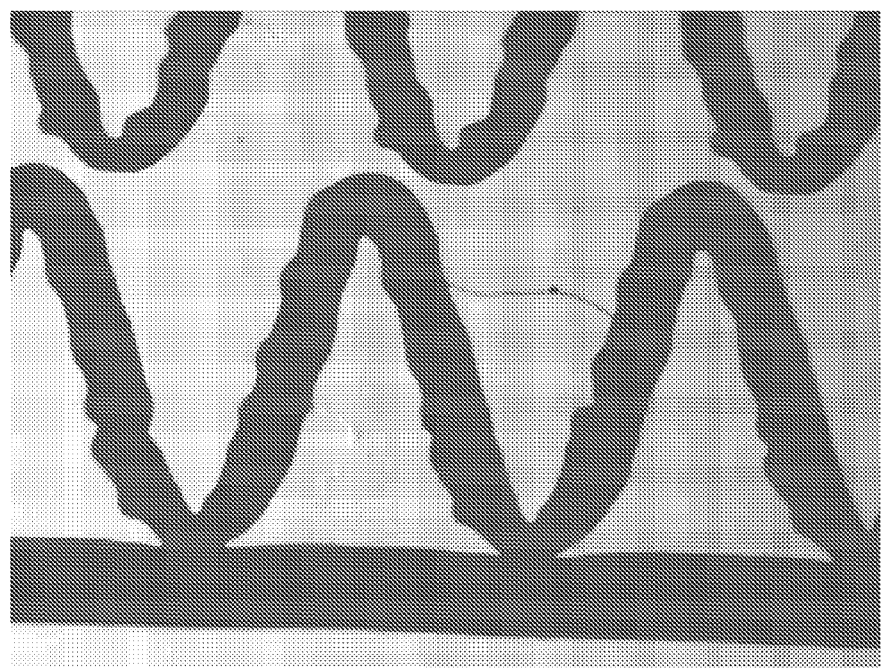
FIG. 5 is a photograph of fiducial marks that have been printed via ink jet on a polyester web in accordance with embodiments of the disclosure.

The photograph of FIG. 5 shows fiducial marks that have been printed via ink jet on a polyester web. As can be seen in FIG. 5, the ink jet printing process produces some distortion in the marks. Individual dots from the printing process can be seen and short term cyclic error from the plot engine is also visible. Imperfections in the fiducial marks may be compensated through various signal processing techniques. For example, the sensor signals generated in response to the marks may be level shifted, filtered, and/or angle adjusted to improve the signal to noise ratio.

Figure 6:
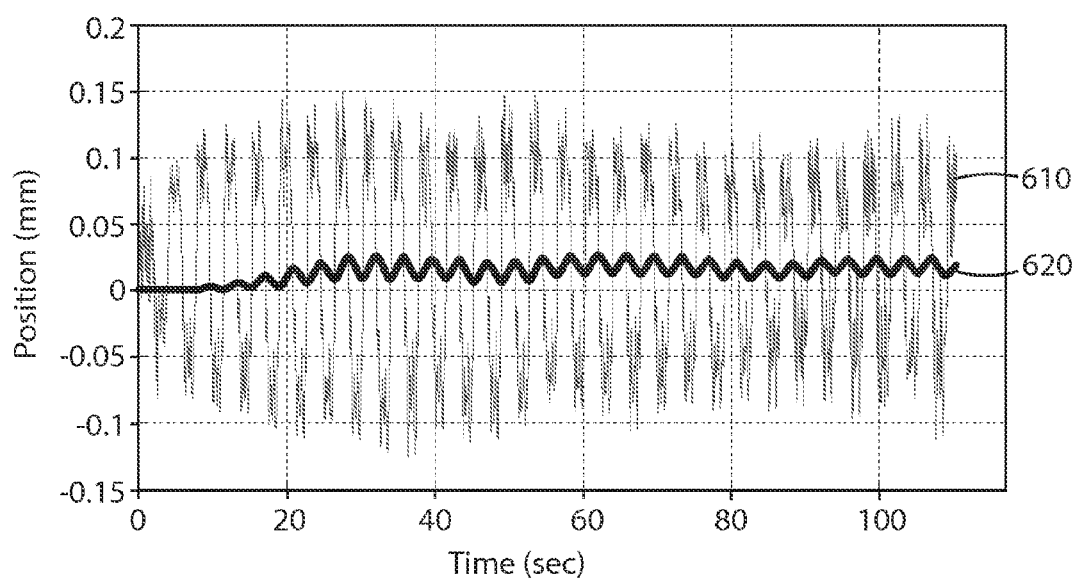
FIG. 6 illustrates the estimated longitudinal position of a web based on noisy data before and after Kalman filtering in accordance with embodiments of the disclosure.

In some embodiments, improvements in the sensor signals may be achieved by linear or non-linear filtering. For example, if a current web speed is known or estimated, bounds can be placed on the next estimated position update. Any value outside these bounds may be assumed to be noise. In particular, recursive filtering, such as through the use of a Kalman filter, may be used to improve the estimated web position. A Kalman filter uses two or more sources of information and combines them to form the best estimated value based on knowledge of the signals' statistics. The statistics may be generated in real time, or for stationary processes may be generated offline to reduce the computational burden. FIG. 6 shows graphs illustrating the estimated position based on noisy inkjet data before 610 and after 620 Kalman filtering. As can be seen in FIG. 6, there is a large cyclic error in the unfiltered signal 610 which is substantially reduced after Kalman filtering is applied 620.

Some embodiments of the invention involve calculating web position error which may be used in a feedback loop to improve the accuracy of the web position determination. The web position error may be determined by comparing the phase of one or more web movement signals generated by an encoder on a web transport roller, for example, with the phase of one or more signals generated by sensing the fiducials on the web. The web movement signal, e.g., the encoder signal, provides an estimated web position. The phase difference between the web movement signal and the fiducial sensor signal represents the web position error. In some implementations, the web position error signal is used to adjust the web movement signal so that the web movement signal is phase-locked to the fiducial sensor signal. As described in more detail below, phase locking the web movement signal with the fiducial sensor signal increases the accuracy of the web position determination.

Figure 7:
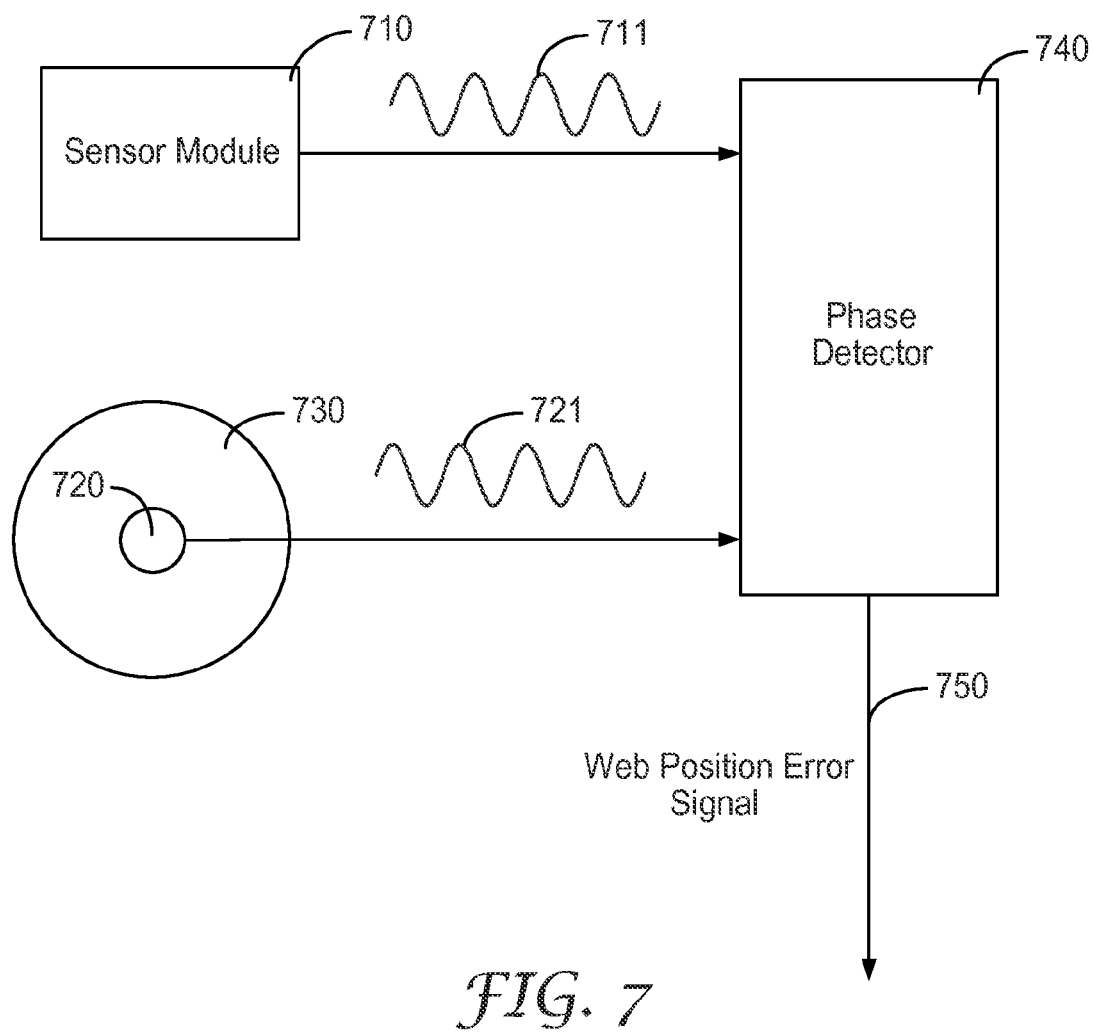
FIG. 7 is a block diagram of a system configured to generate a web position error signal.

FIG. 7 illustrates an approach for generating a web position error signal. A sensor module 710 senses one or more fiducials arranged along the longitudinal axis of the web and generates a continuous, periodic fiducial sensor signal 711 based on the sensed fiducials. The sensor module may include circuitry for filtering, scaling, and/or otherwise processing the sensor signal. A web movement signal 721 is generated based on web movement and represents the estimated position of the web. For example, the web movement signal 721 may be generated by an encoder 720 on a pull roll 730 which used is to transport the web. The web movement signal 721 and the fiducial sensor signal 711 are input to a phase detector 740 which determines the phase difference between the web movement signal 721 and the fiducial sensor signal 711. The phase difference is a measure of the web position error of the encoder signal 721. The phase detector 740 generates a web position error signal 750 based on the phase difference. The web position error signal 750 may be converted to a linear distance, e.g., microns.

Figure 8:
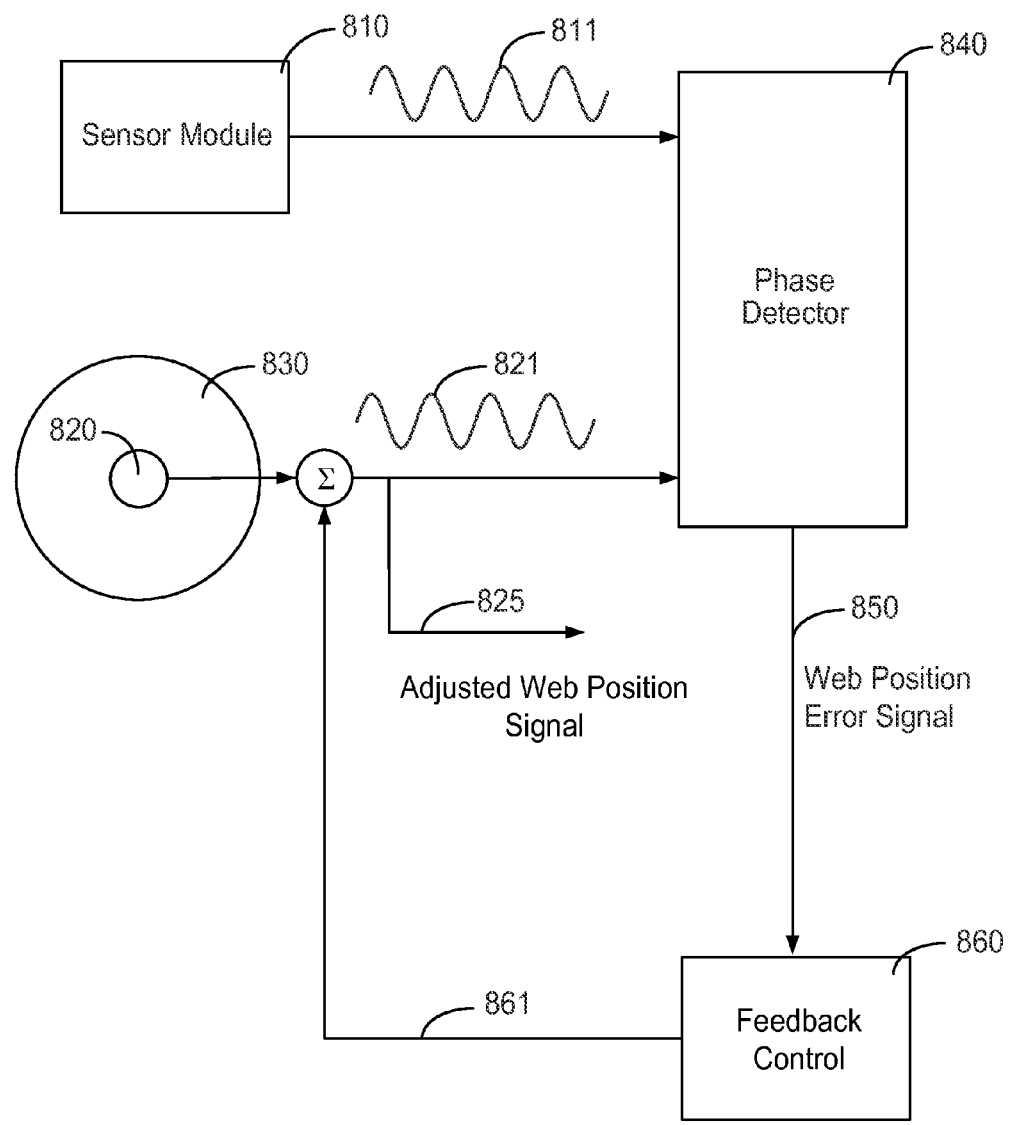
FIG. 8 is a block diagram of a system configured to use the web position error signal to provide an adjusted web position signal.

The error detection system of FIG. 7 may be expanded to include feedback that corrects the web movement signal based on the web position error signal. FIG. 8 illustrates the feedback system. As previously described in connection with FIG. 7, a sensor module 810 senses one of more fiducials on the web and generates fiducial sensor signals. An encoder 820 on a web roller 830 generates one or more signals 821 related to web movement. The fiducial sensor signals 811 and the encoder signals 821 are input to a phase detector 840 which determines the difference in phase between the fiducial sensor signals 811 and the encoder signals 821. The phase detector 840 outputs a web error signal 850 based on the phase difference.

The error signal 850 can be used to improve the accuracy of the encoder signals 821. FIG. 8 illustrates a closed loop feedback circuit that can be used to adjust the encoder signals 821 so that the encoder signals 821 are synchronized with the fiducial signals 811. Feedback control circuitry 860, such as a proportional-integral (PI) controller or a proportional integral-differential (PID) controller generates a feedback signal 861 that is summed with the output from the encoder 830. The output from the summer provides an adjusted web position signal 825. The adjusted web position signal 825 is, in effect, a web encoder signal.

The adjusted web position signal 825 provides enhanced web position determination at least in part because the adjusted web position signal 825 is "cleaner" (less noisy) than the sensed fiducial signals 811. The feedback approach described in FIG. 8 allows the use of sensed fiducials on the web to modify the encoder signal so that changes in the web, such as stretching, shrinking, and/or other distortions, are detected and the web position is corrected relative to the expected distance along the longitudinal web axis. The adjusted web position signal may be used to control various fabrication processes, such as ink jet printing, photolithographic patterning, and/or other fabrication processes.

Figure 9:
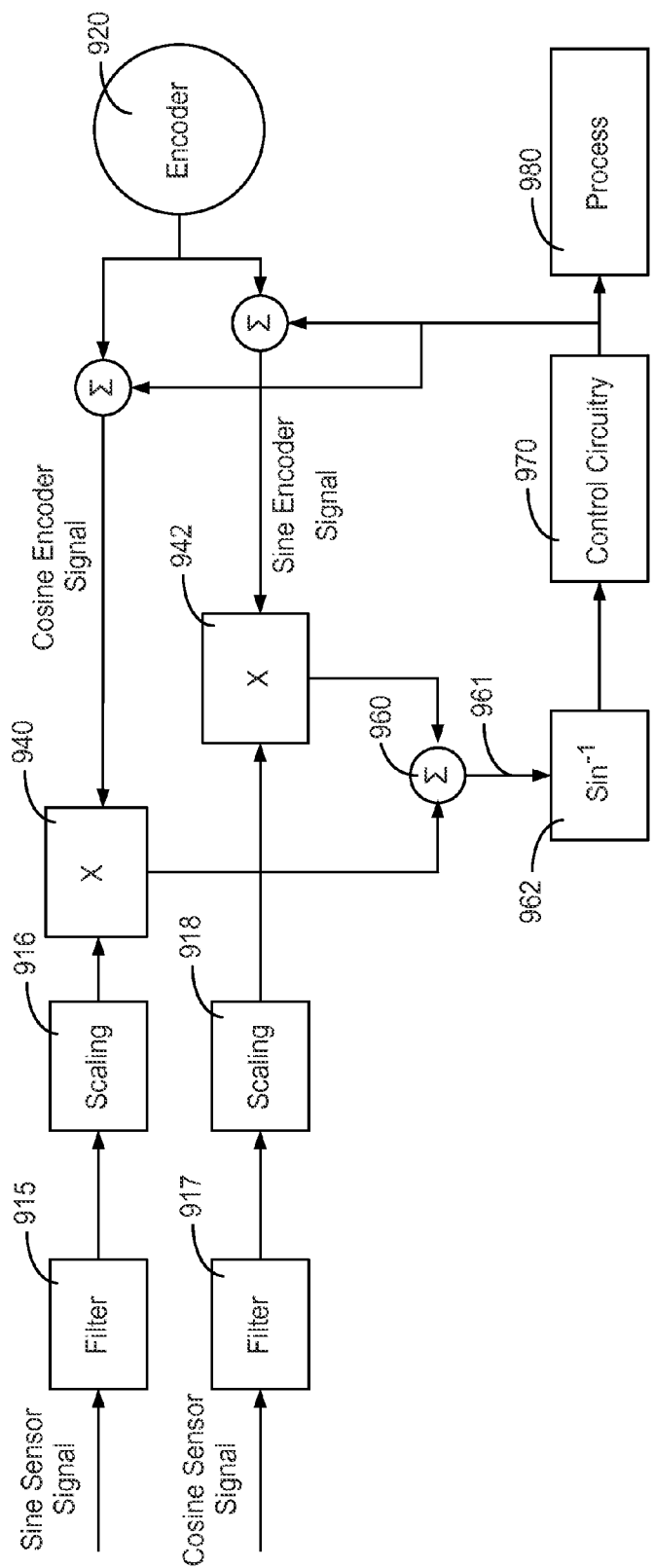
FIG. 9 illustrates a system that provides error detection and feedback based on two fiducial sensor signals that are out of phase with each other.

FIG. 9 illustrates a system that provides error detection and feedback based on two fiducial sensor signals that are out of phase with each other, such as sine and cosine signals. The error calculation involves determining the phase difference between the fiducial sensor signals and the movement signals. A first product of the sine fiducial sensor signal and the cosine movement signal is calculated and a second product of the cosine fiducial sensor signal and the sine movement signal is calculated. These calculations allow the use of a trigonometric identity (see, Equation 1 below) to determine the sine of the phase difference, $\sin(u \pm v)$. The error signal is generated as the arcsin of the phase difference.

FIG. 9 illustrates filters 915, 917 and scaling circuitry 916, 918 used to process the fiducial sensor signals. For example, the fiducial sensor signals may be filtered to remove extraneous noise and/or scaled to +/−1 peak to peak signals prior to their input into signal multiplication circuitry 940, 942. Sine and cosine encoder signals are generated by an encoder 920 coupled to a roller used to transport the web. The sine and cosine encoder signals are input to the signal multiplication circuitry 940, 942.

The multiplication circuitry 940, 942 calculates the product of the sine sensor signal and the cosine encoder signal and the product of the cosine sensor signal and the sine encoder signal. Based on the trigonometric identity, the sine of the phase difference $\sin(u \pm v)$ is calculated as follows:

$$\sin(u \pm v) = \sin(u)\cos(v) \mp \cos(u)\sin(v) \qquad \text{Equation 1}$$

where $\sin(u)$ is the sine sensor signal; $\cos(v)$ is the cosine movement signal; $\cos(u)$ is the cosine fiducial signal; and $\sin(v)$ is the sine movement signal. The products $\sin(u)\cos(v)$ and $\cos(u)\sin(v)$ are input to the summation block 960. The output 961 of the summation block 960 is the sine of the phase error between the fiducial sensor signals and the encoder signals. As illustrated in FIGS. 7 and 8, either one sinusoidal signal may be used, however, using both sine and cosine signals enhances accuracy and direction tracking Periodic signals other than sinusoids may alternatively be used.

Circuitry 962 takes the arcsin of the phase error signal 961, generating the web position error in radians. The error signal is applied to control circuitry 970, such as a proportional-integral-derivative (PID) controller, or other type of controller. The output of the controller 970 can be used to adjust the encoder signals as discussed in connection with FIGS. 7 and 8, or can be used to control the fabrication process 980, such as by controlling web position. In some embodiments, the phase error signal 961 is directly applied to adjust the encoder signals or to control the process without the controller circuitry 970.

Figure 10:
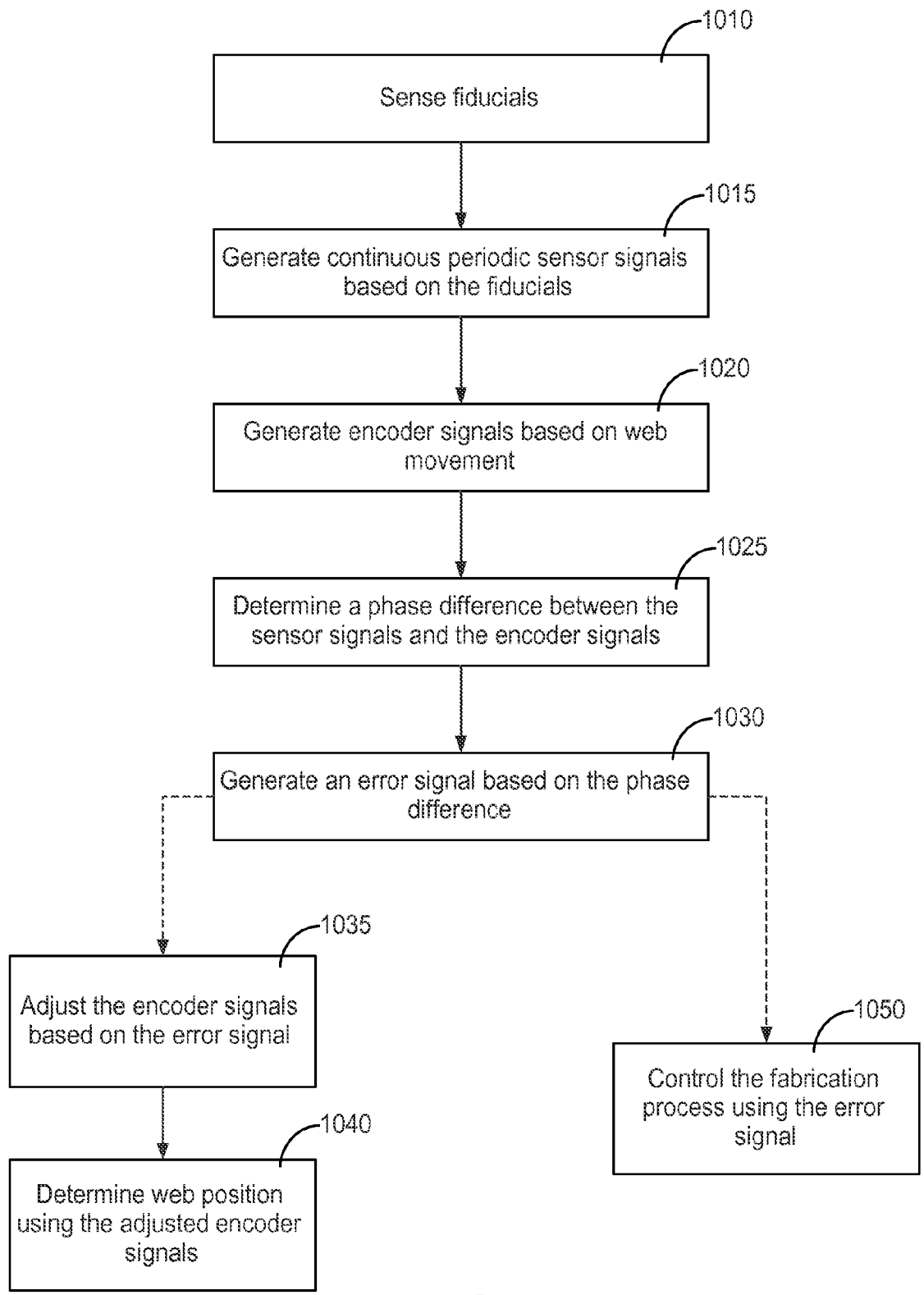
FIG. 10 is a flow diagram illustrating a process of using phase locking for controlling a fabrication process and/or adjusting encoder signals for web position determination.

FIG. 10 is a flow diagram illustrating a process of phase locking to adjust encoder signals for web positioning and/or for controlling the fabrication process. One or more fiducials arranged longitudinally on the web are sensed 1010 by a sensor module. Continuous, periodic signals are generated 1015 based on the sensed fiducials. In some embodiments, the fiducials comprise continuous, periodic fiducials that may be printed or otherwise arranged along the longitudinal axis of the web. In some implementations, the fiducials comprise features that modulate energy to generate a continuous fiducial sensor signal. Features that modulate light or other types of energy to generate a continuous fiducial sensor signal are further described in commonly owned U.S. Patent Application Ser. No. 60/944,882 filed on Jun. 19, 2007 and incorporated herein by reference.

Web movement signals are generated 1020 based on web movement. As previously discussed, an encoder used to track web movement can provide the web movement signals. The phase difference between the fiducial sensor signals and the web movement signals is calculated 1025. An error signal is generated 1030 based on the phase difference. In one optional process, the error signal may be used to adjust 1035 the encoder signals. The web position can be determined 1040 based on the adjusted encoder signals. As another optional process, the error signal may be used 1050 to control other aspects of a fabrication process, such as web speed. In some applications, both optional processes illustrated in FIG. 10 are implemented.

Phase locking to determine an adjusted web position as described in connection with FIGS. 7-10, for example, can be used to provide highly accurate web positioning over a number of periodic cycles of the fiducial sensor signals. However, in some implementations, there is little advantage in maintaining position adjustment over long distances relative to the periodic fiducial signals. The large majority of patterns that are formed on a web may be relatively small scale. For example, a display screen of about 20 inches may be fabricated using web position sensing techniques as described herein. For a 20 inch display screen, the web pattern can be readjusted every 24 inches or so.

Figure 11:
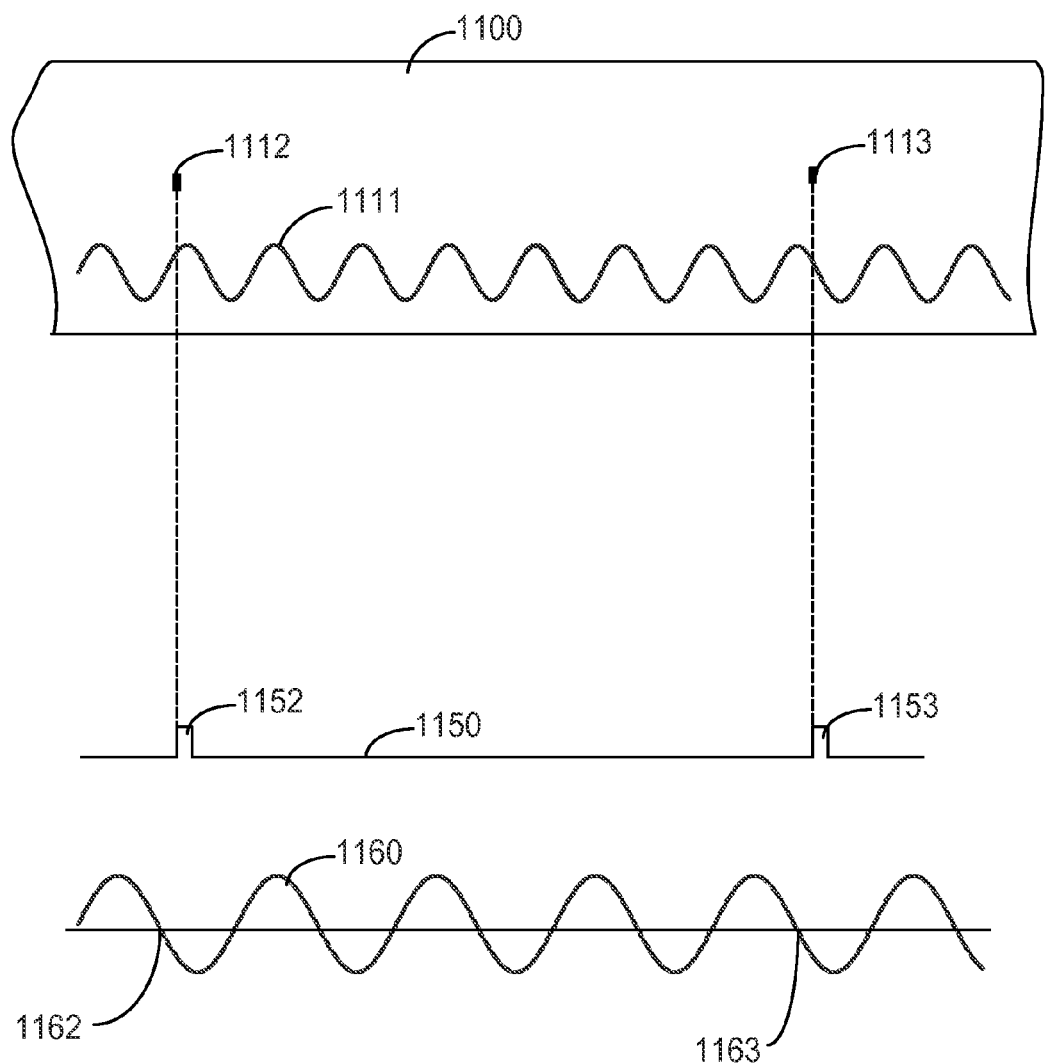
FIG. 11 illustrates an approach for periodically making an absolute position determination of the web position.

The readjustment of the web pattern can be accomplished based on discrete fiducial marks (zero marks) disposed on the web which are used in conjunction with the continuous fiducial marks. The discrete marks are used by substrate position circuitry to determine an absolute web position corresponding to the start of a pattern and the continuous fiducials are used to determine web position within the pattern area. FIG. 11 illustrates a portion of a web 1100 having a continuous, periodic fiducial 1111 and zero marks 1112, 1113 arranged at repeatable intervals. The interval between the zero marks may be selected based on the size of the pattern being fabricated. For example, if a circuit that is 6 inches long is being patterned on the web, the zero marks may be disposed at 8 inch intervals along the web.

As the web position is being tracked by the substrate position circuitry, a secondary sensor identifies the passing of a zero mark 1112, 1113. The output 1150 of the secondary sensor is illustrated in FIG. 11. For example, the detection of a zero mark may generate a pulse 1152, 1153 which is used to identify the starting point for a pattern. Sensing a zero mark initiates a calculation by the substrate position circuitry to identify the most recent zero crossing of the adjusted web position signal 1160. Zero crossing 1162 is identified as the most recent zero crossing for zero mark 1112. Zero crossing 1163 is identified as the most recent zero crossing for zero mark 1113. Note that the adjusted web position signal in this example is a sinusoid and has two zero crossings per cycle. As long as the zero mark 1112. 1113 is detected within a single cycle of the sinusoidal signal 1160, the correct last zero crossing 1162, 1163 of the adjusted web position signal 1160 will be accurately determined.

The embodiments described herein involving continuous fiducial marks provide for continuous tracking of the longitudinal position of a moving web. Simple approaches may be used to apply the web fiducials to general purpose webs such as webs made of paper, fiber, woven or nonwoven material. The webs may comprise polyester, polycarbonate, PET, or other polymeric webs. The redundancy available through the use of sine and cosine marks provides high noise immunity and allows accurate web positioning. The approaches are particularly useful when used in conjunction with flexible webs.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method, comprising:
sensing one or more substantially continuous fiducials disposed along a longitudinal axis of a substrate;
generating one or more continuous, periodic sensor signals based on the sensed fiducials;
generating one or more continuous, periodic movement signals based on movement of the substrate, the movement signals representing an estimated position of the substrate;
determining a phase difference between the sensor signals and the movement signals;
generating an error signal based on the phase difference; and
determining a substrate position by adjusting the estimated position of the substrate based on the error signal.

2. The method of claim 1, wherein sensing the fiducials comprises sensing one or more substantially continuous, periodic fiducials.

3. The method of claim 1, wherein sensing the fiducials comprises sensing two substantially continuous, periodic fiducials that are out of phase with each other.

4. The method of claim 1, further comprising controlling a fabrication process based on the substrate position.

5. The method of claim 1, further comprising adjusting the movement signals based on the error signal and controlling movement of the substrate based on the adjusted movement sensor signals.

6. The method of claim 1, further comprising:
sensing a reference fiducial disposed along the longitudinal axis of the substrate; and
determining an amplitude of the one or more fiducials based on the reference fiducial.

7. The method of claim 1, further comprising:
sensing a reference fiducial disposed along the longitudinal axis of the substrate; and
determining lateral position of the substrate using the reference fiducial.

8. The method of claim 1, wherein sensing the fiducials comprises sensing one or more substantially continuous, periodic fiducials; and
further comprising detecting discrete fiducial marks on the substrate and initiating identification of a nearby zero crossing of the periodic fiducial marks based on detection of the discrete fiducial marks.

9. A method, comprising:
sensing one or more fiducials disposed along a longitudinal axis of a substrate;
generating one or more continuous, periodic sensor signals based on the sensed fiducials;

generating one or more continuous, periodic movement signals based on movement of the substrate;

determining a phase difference between the sensor signals and the movement signals; and generating an error signal based on the phase difference, wherein:

generating the one or more sensor signals comprises generating sine and cosine sensor signals;

generating the one or more movement signals comprises generating sine and cosine movement signals;

determining the phase difference between the sensor signals and the movement signals comprises:
  determining a first product of the sine sensor signal and the cosine movement signal;
  determining a second product of the cosine sensor signal and the sine movement signal; and
  determining a difference between the first product and the second product; and generating the error signal comprises taking an arcsin of the difference between the first product and the second product.

10. A method, comprising:

sensing one or more fiducials disposed along a longitudinal axis of a substrate;

generating one or more continuous, periodic sensor signals based on the sensed fiducials;

generating one or more continuous, periodic movement signals based on movement of the substrate;

determining a phase difference between the sensor signals and the movement signals;

generating an error signal based on the phase difference;

adjusting the movement signals based on the error signal; and determining a substrate position along the longitudinal axis based on the adjusted movement sensor signals.

* * * * *